United States Patent [19]

Bohac, Jr.

[11] Patent Number: 5,103,160

[45] Date of Patent: Apr. 7, 1992

[54] SHUNT REGULATOR WITH TUNNEL OXIDE REFERENCE

[75] Inventor: Frank J. Bohac, Jr., Laguna Hills, Calif.

[73] Assignee: Hughes Aircraft Company, Los Angeles, Calif.

[21] Appl. No.: 691,296

[22] Filed: Apr. 25, 1991

[51] Int. Cl.⁵ ............................................. G05F 1/613
[52] U.S. Cl. .................................... 323/351; 323/223
[58] Field of Search ................ 323/220, 223, 224, 225, 323/349, 351, 282

[56] References Cited

U.S. PATENT DOCUMENTS

| | | | |
|---|---|---|---|
| 4,374,357 | 2/1983 | Olesin et al. | 323/351 |
| 4,628,250 | 12/1986 | Lee | 323/351 |
| 4,713,600 | 12/1987 | Tsugaru et al. | 323/351 |
| 4,825,018 | 4/1989 | Okada et al. | 323/351 |
| 4,882,534 | 11/1989 | Koshizuka | 323/351 |
| 4,965,696 | 10/1990 | Kumpfmueller et al. | 323/351 |

Primary Examiner—Peter S. Wong
Attorney, Agent, or Firm—Jeannette M. Walder; Terje Gudmestad; W. K. Denson-Low

[57] ABSTRACT

A shunt regulator for the programming voltage of programmable circuit devices employs components formed of the same layers that make up the regulated devices, including the same tunnel structure (52) of floating gate devices that are being regulated. A transistor (66) connected as a load on the programming voltage line (10) is itself controlled by tunneling structure (52) and capacitors (18, 20) formed by layers corresponding to layers of the regulated devices so that variations in the regulator components will track variations of the regulated components to automatically compensate for manufacturing process variations.

22 Claims, 3 Drawing Sheets

SHUNT REGULATOR WITH TUNNEL OXIDE REFERENCE

BACKGROUND OF THE INVENTION

1. Field of the Invention

The present invention relates to a shunt regulator for regulating programming voltage employed to erase or write to nonvolatile memory devices, and more particularly concerns regulation by means of components that are subject to manufacturing process variations and wear out mechanisms that are the same as manufacturing process variations and wear out mechanisms of the regulated devices.

2. Description of Related Art

Programming voltages employed to provide power to various nonvolatile programmable devices during device programming are often generated at a level above the level actually required in order to ensure that the voltages actually applied will be adequate. For example, if a programming voltage of 10 volts is required for operation of an ideal circuit, it is possible that variations in manufacturing processes could cause the circuit to require a voltage of several volts more than the nominal. Accordingly, voltage sources are established for the circuit to account for a higher voltage that could be required, and voltage regulators are employed to limit the higher voltage generated to the desired value.

Shunt voltage regulators of the prior art have been based primarily on zener diodes or band gap references, which have several disadvantages. In many integrated circuit manufacturing processes zener diodes cannot be manufactured without adding additional processing steps. The use of band gap reference for voltage regulation requires a large area of the chip, and, furthermore, draws DC current. Neither zener diode nor band gap based regulators will track manufacturing process variations or the charge trapping wear out of the nonvolatile programmable devices to be regulated.

In the manufacture of integrated circuit devices operation of the components and voltages that are required at various points in the circuit depend on a number of different process steps. Various layers of material are deposited with ideally predetermined precision and precisely controlled thicknesses. However, should the actual thickness of some layers vary, or should one or more of the deposited layers have other than the predetermined impurities therein, circuit operation and circuit voltages of the resulting product will vary. Prior shunt regulators, such as zener diodes and band gap based regulators, establish a predetermined fixed regulation and will not track process manufacturing process variations. That is, they will not vary the level of regulated voltage as may be required by variations in manufacturing processes. It has been established that floating gate devices exhibit a wear out mechanism caused by trapped charge in the tunneling oxide. This manifests itself as reduced threshold shifts during the program cycle.

Regulators based on MOSFET threshold voltage are exceedingly sensitive to process and temperature variations and, moreover, will not track the manufacturing process of nonvolatile circuits.

Accordingly, it is an object of the present invention to provide a voltage regulator that avoids or minimizes above mentioned problems.

SUMMARY OF THE INVENTION

In carrying out principles of the present invention in accordance with a preferred embodiment thereof, a shunt regulator for a floating gate nonvolatile device employs as a reference the same tunnel structure as used in the floating gate device. The regulator components, being manufactured together with the regulated devices, automatically adjust for manufacturing process variations. They require no extra manufacturing processing steps, require but a small area of the chip, are relatively insensitive to temperature, and draw no DC current.

Device life is extended because the program voltage is raised to offset the effect of reduced threshold shifts caused by the trapped charge. Since the shunt regulator uses the same tunnel diode as the programmed elements, it will automatically compensate for the trapped charge by raising the programming voltage.

BRIEF DESCRIPTION OF THE DRAWINGS

In the accompanying drawings:

FIG. 3 is a graph illustrating various voltages in the regulator;

DESCRIPTION OF THE PREFERRED EMBODIMENT

Figure 1:
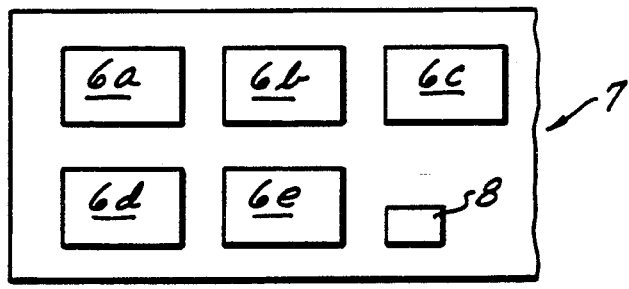
FIG. 1 is a greatly simplified fragmentary plan view illustrating the arrangement of a shunt regulator and various regulated devices on a single chip.
Figure 2:
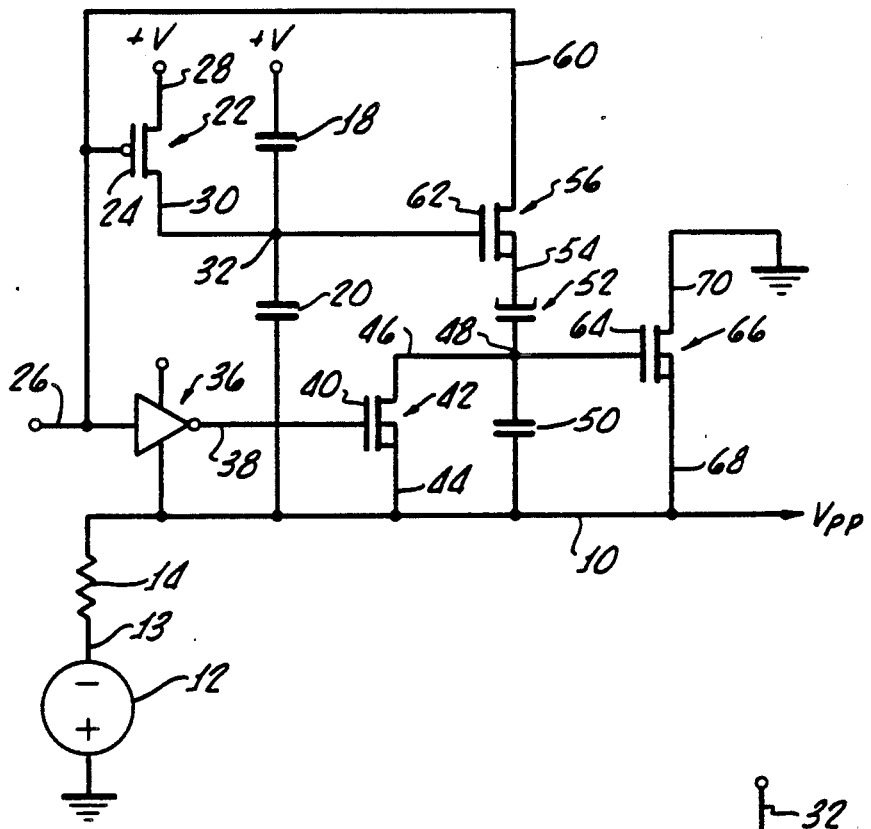
FIG. 2 illustrates a shunt regulator circuit embodying principles of the present invention.
Figure 4:
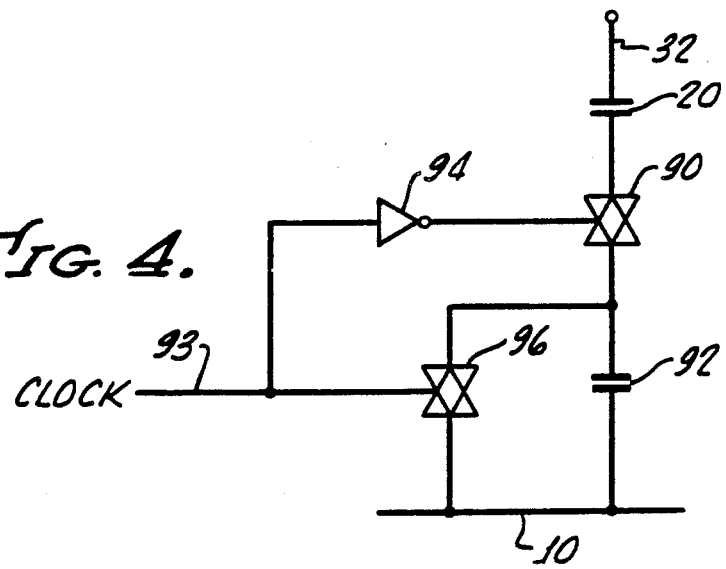
FIG. 4 illustrates a circuit modification for rounding the leading edge of the regulated voltage.
Figure 5:
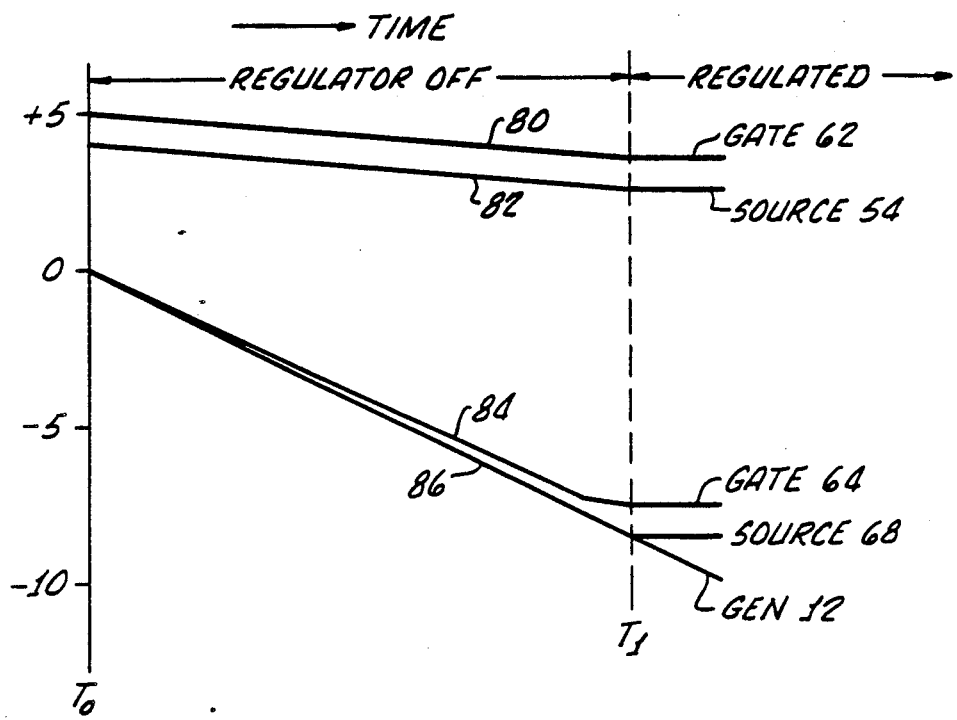
FIG. 5 illustrates another modification of the voltage regulator.

FIG. 1 illustrates a plan view of an exemplary integrated circuit embodying a plurality of programmable nonvolatile regulated devices 6a, 6b, 6c, 6d, 6e formed on a single chip 7, together with a single shunt regulator 8 of the type illustrated in FIGS. 2, 4 or 5. FIG. 1 merely illustrates the fact that a single shunt regulator of the type described herein may be employed to regulate voltage applied to a number of circuits 6a through 6e (and many more on the same chip), and, importantly, is formed on the same chip and in the same manufacturing process as are the various components of circuits 6a through 6e.

As illustrated in FIG. 2, power supplies, shown as +V, are provided for the entire chip, including the nonvolatile programmable devices and the regulator described herein. From these voltage supplies a programming voltage $V_{pp}$ is to be generated on a line 10 by a generator 12, which may merely multiply the voltage supply +V to feed the generated voltage through a very high resistance 14. The programming voltage $V_{pp}$ provides power for many of the components of the programmable devices and may, for example, establish logic zero voltage levels for various gates, as will be described more particularly below. The voltage provided by generator 12 is caused to pulse negatively, when programming, so as to drop rapidly from a zero volt (ground) level to a level in the order of −15 or −20 volts for example. Because $V_{pp}$ is required to be established at a higher level than the maximum negative voltage from generator 12, namely at a level of −12 volts for example, where the +V supply is +5 volts, and generator 12 supplies −15 to −20 volts, a regulator is required to limit the voltage on line 10.

The regulator described herein includes a pair of capacitors 18,20 connected in series between +V and line 10, and a P channel MOSFET transistor 22, having a control gate 24 connected to a program input line 26, a source 28 connected to V+ and a drain 30 connected to a junction 32 between capacitors 18 and 20. The regulator further includes an invertor 36 receiving the program input on line 26 and having an output on a line 38 connected to a control gate 40 of an N channel MOSFET transistor 42 of which the source 44 is connected to line 10, and the drain 46 is connected to a junction or node 48. Node 48 is the connection between a capacitor 50, having its other side connected to line 10, and the tunnel structure, generally indicated at 52, which is formed between node 48 and a source 54 of an N channel transistor 56. N channel transistor 56 has its drain 60 connected to the program input on line 26 and its control gate 62 connected to the junction 32 between capacitors 18 and 20. Node 48 is also connected to the control gate 64 of an N channel voltage regulating transistor 66, having its source 68 connected to regulate the voltage on line 10 and its drain 70 connected to ground.

Invertor 36, together with transistors 22 and 42, form a pre-charge circuit which, when the regulated devices are not being programmed, keep capacitors 18 and 50 discharged and shunt the control gate to source of transistor 66. When the regulator devices are not being programmed, the program input on line 26 is low. The low signal on the control gate 24 of P channel transistor 22 and the inverted high signal on control gate 40 of N channel transistor 42 turn these two transistors on, which accordingly shunt the capacitors 18 and 50 respectively, keeping the capacitors discharged. Thus the voltage at node 32 is at +V and node 48 is at the voltage level on line 10, which at this time is held at ground. With pre-charge transistor 42 conducting, control gate 64 of transistor 66 is connected to its source so that this transistor is turned off. When the circuit is not being programmed, other circuits (not shown) will operate to hold the voltage on line 10 at ground. The programming voltage of generator 12 is taken sharply low, and voltages at nodes 60, 54 and 48 are at ground for programming. Just before this voltage is taken low the input programming voltage on line 26 and the drain 60 of transistor 56 is taken high to turn off pre-charge transistors 22 and 42.

Capacitors 18 and 20 act as a voltage divider, having geometries that are the same as the geometries of the nonvolatile devices being regulated, since these capacitors are formed of the same layers as the layers of the device being regulated, as will be described more particularly below. Therefore, the coupling coefficient or divider ratio of the capacitors is the same as that of the regulated devices, which is part of the manufacturing process tracking provided by the present invention. Transistor 56 is connected as a source follower, and thus buffers the output of the divider formed by capacitors 18 and 20 at junction or node 32. As the programming voltage from generator 12 drops, the voltage at node 32 begins to decrease, whereas voltage at junction 48 of capacitor 50 closely follows the decreasing programming voltage on line 10. The tunneling structure 52 will conduct when the voltage across it is at about 10 volts. However, until the voltage across tunneling structure 52 reaches that level, the tunnel structure acts as a small capacitor, which, together with capacitor 50, forms a second capacitative voltage divider. In the voltage divider formed by tunneling structure 52 and capacitor 50, the latter is considerably larger, so that as the voltage on line 10 decreases most of the voltage change occurs across the tunneling structure, and the voltage at node 48 more closely follows the dropping voltage on line 10, though it remains at a slightly increased value relative to the voltage on line 10.

This operation can be seen in the diagram of FIG. 3, wherein time T0 indicates the beginning of the drop of voltage generator 12, with curve 80 representing the voltage at junction 32 (gate 62 of transistor 56), and curve 82 representing the voltage at the source of transistor 56 (on one side of tunnel structure 52). Curve 84 represents voltage at junction 48, whereas curve 86 represents the voltage on line 10. From time T0 until time T1, which is indicated by the vertical dotted line, the voltages vary and no regulation occurs. Transistor 66 remains cut off.

As the generator 12 pulses in a negative direction, the voltage at junction 32 decreases proportionally because of the voltage divider action of capacitors 18 and 20. Capacitor 20 is considerably larger than capacitor 18 and may be, for example, four times as large. In such a case voltage at junction 32 will decrease 0.2 volts for every 1.0 volt drop in the voltage on line 10. Transistor 56, being connected as a source follower, has its source 54 follow the slowly dropping voltage at junction 32, with the source voltage of this transistor 56 remaining at about 1 volt below the voltage on its control gate, at junction 32 (see curves 80,82).

Capacitor 50 is much greater than the capacitance of the tunnel structure 52 (when the latter is not conducting) so that the voltage at junction 48 stays slightly above the voltage on line 10, as can be seen in FIG. 3. Thus the gate to source voltage of regulating transistor 66 is small, and this transistor remains turned off. As the voltage on line 10 continues to go more negative, the voltage across the tunnel structure increases because the voltage on the source of transistor 56, as indicated at curve 82 of FIG. 2, decreases at a much lower rate than does the voltage on gate 64, curve 84. When the voltage across the tunnel structure reaches about 10 volts, the tunnel structure begins to conduct, charging capacitor 50 and increasing the voltage at junction 48, which is connected to the control gate 64 of regulating transistor 66. When the voltage across capacitor 50 reaches the threshold voltage of transistor 66, that is when the voltage between the control gate and source of transistor 66 rise to this threshold value, the transistor 66 turns on. This threshold value of the gate to source voltage of transistor 66 is about 1 volt. With a 1 volt potential across the gate to source of the regulating transistor the transistor conducts with a relatively high resistance. Thus, with approximately 1 volt across its gate to source, transistor 66 conducts with a voltage drop from its drain (connected to ground) to source that is sufficient to hold the programming voltage on line 10 at about −12 volts, even though the voltage generator 12 should provide a voltage that drops as low −20 volts. It may be noted that the resistance of resistor 14, which may be in the order of 100 kilohms, is considerably greater than the conducting resistance of transistor 66, so that most of the voltage from the generator is dropped across resistor 14, and the programming voltage on line 10 is appropriately limited.

The voltage regulation that is achieved may be defined by the following equation:

$$V_{REG} = (V_{TUN} + V_{56} + V_{66})/C_c$$

where $C_c$ = the capacitance of capacitor 18 divided by the sum of the capacitance of capacitors 18 and 20. $V_{TUN}$ is the voltage at which the tunnel structure 52 begins to conduct. $V_{56}$ is the voltage drop across the conducting transistor 56, and $V_{66}$ is the voltage across the gate to source of transistor 66.

From the above equation it can be seen that the regulated voltage $V_{REG}$ increases if $V_{TUN}$ or either $V_{56}$ or $V_{66}$ increases, or if $C_c$ decreases. Thus the regulated voltage tracks the voltage required to program the nonvolatile regulated devices. This is so because the several voltages, $V_{TUN}$ or $V_{56}$ or $V_{66}$ and capacitance $C_c$ vary with the manufacturing processes, as mentioned above. In particular, these values vary with such variables as actual thickness of the several layers and impurities of the layers. The voltage required to program the regulated devices also varies with thickness of the several layers and impurities therein, and thus the same manufacturing process variations affect both the regulator and the regulated devices in the same manner. Accordingly, the regulator automatically compensates for changes in the manufacturing process.

To summarize the above described operation, when the programming voltage on line 10 goes below ground by a voltage equal to the voltage across tunneling structure 52 plus the N channel thresholds of both transistors 56 and 66, divided by the coupling coefficient of capacitors 18 and 20, transistor 66 turns on and prevents further decreases in the programming voltage on line 10. The tunneling structure is only required to charge capacitor 50 to a single N channel transistor threshold for each programming cycle so that the tunneling structure conducts for only a short time and, importantly, a constant current through the tunnel during each programming cycle is not necessary. Such a constant current through the tunneling structure would quickly wear out the tunnel device. Use of capacitative rather than resistive voltage dividers limits the amount of current drawn by the regulator circuit.

Illustrated in FIG. 4 is a modification of a portion of the circuit of FIG. 1 to provide a slower or more rounded leading edge at the point of regulation of the programming voltage on line 10. Instead of abruptly and sharply stopping the drop in the programming voltage at the point of regulation, the modification of FIG. 4 enables the voltage to more slowly change from the generated value to the regulated value. This slower regulation benefits the tunneling structure by reducing the stress on the tunneling structure during programming, because the actual tunneling begins more slowly rather than abruptly.

The arrangement of FIG. 4 shows only part of the circuit of FIG. 2. FIG. 4 shows a modification of the connection of capacitor 20 to the programming voltage line 10. The remainder of the circuit is the same as in FIG. 2. Thus the one side of capacitor 20 is still connected to the capacitor 18 and to the source of transistor 22 (not shown in FIG. 4) just as shown in FIG. 2. However, the other side of capacitor 20, instead of being connected directly to the programming line 10, is connected to the line through a first switch 90 and a second capacitor 92. The latter is shunted by a second switch 94 connected between the programming line 10 and the other side of capacitor 92. A clock signal of line 93 is fed through an invertor 94 to the first switch 90 and directly to the second switch 94. Thus capacitor 20 is only periodically connected to the programming line 10, through the periodically shunted capacitor 92. Capacitor 92 is much smaller than capacitor 20. The clock signal in FIG. 4 simultaneously closes one of the switches and opens the others and does this in alternation to provide a time constant for the circuit, depending upon the ratio of the sizes of the two capacitors and the frequency of the clock. The operation is such as to alternately charge and discharge capacitor 92, and thus smooth the transition of the programming voltage on line 10 to its limited value.

Tunneling structures, because they employ very thin oxide layers, are susceptible to premature failure due to oxide shorts. In the circuit of FIG. 2, if the tunneling structure 52 should become shorted, capacitor 50 would start charging immediately, as soon as the programming voltage on input line 26 goes high for programming and turns off the transistors 22 and 42. This would keep the voltage at junction 48 at a single N channel threshold (about 1 volt) below the positive supply +V as the voltage divider action of capacitors 18,20 feed the +V voltage supply across the gate to source of transistor 56 and through the shorted tunnel structure 52. With this relatively high voltage on its control gate, transistor 66 conducts in a low resistance mode. The characteristics of the transistor 66 are such that with a voltage of about 1 volt across its gate to source its conductive resistance is relatively high, whereas with a voltage of 4 volts or more its conductive resistance is low. Thus, with a shorted tunnel structure, programming line 10 is effectively held to the voltage level at the ground connection of the drain 70 of transistor 66.

To avoid the problem of a shorted tunnel structure, the modification of FIG. 5 is employed. In this arrangement a P channel MOSFET transistor 100 is connected between the drain 70 of the regulated voltage controlling transistor 66 and ground. The gate 64 of transistor 66 is connected to the junction 48, capacitor 50, tunneling structure 52, source 54, and control gate 62 of transistor 56, just as in the circuit of FIG. 2. These elements are also connected to the pre-charging structure of transistors 22 and 42, capacitors 18,20 and invertor 36 of FIG. 2, none of which are show- in FIG. 5. Thus, FIG. 5 shows only that part of the circuit of FIG. 2 that is modified to avoid the problems of a shorted tunnel structure.

Transistor 100 prevents a shorted tunnel oxide in tunneling structure 52 from limiting the programming voltage on line 10 to a low (less negative) voltage. The control gate 102 of transistor 100, which has its source 104 connected to ground, is connected to the junction 48 between one side of the tunneling structure and the control gate of transistor 66. Transistor 100 cannot turn on unless the voltage at junction 48 drops to or below −2 volts, which is one P channel threshold plus a back gate bias below ground. If transistor 100 is not turned on, the primary controlling transistor 66 cannot conduct, and thus the regulator, with the addition of transistor 100, is effectively fail safe upon occurrence of a shorted tunnel structure. In other words, the shunt regulator will allow the unregulated voltage from generator 12 to be applied but will not disable (ground) the programming voltage line. When the tunneling structure shorts, the voltage at junction 48 will not drop sufficiently to cause transistor 100 to turn on, and thus the fail safe condition occurs. In normal operation, transistor 100 has no effect on the circuit because, with a good tunnel structure, the voltage at junction 48 will be about −8 to −9 volts when transistor 66 starts to conduct to limit the negative programming voltage on line 10. This voltage of −8 volts is greater (more negative) than the voltage needed to turn on transistor 100, which accordingly conducts to allow transistor 66 to operate normally.

With the arrangement of FIG. 5 a shorted tunnel structure causes the shunt regulator to fail in an "open" (unregulated) condition rather than in a shorted condition. Therefore two or more of the described regulator circuits can be connected in parallel, as is also shown in FIG. 5. Thus the source 54 of transistor 56 is connected to a second tunneling structure 108 (corresponding to tunneling structure 52), which is in turn connected to a capacitor 110 (corresponding to capacitor 50), with the capacitor 110 being discharged before programming by an N channel MOSFET transistor 112 corresponding to transistor 42 of FIG. 2. The junction 114 between the tunneling structure 108 and capacitor 110 is again connected to the gates of a primary controlling transistor 120 (corresponding to transistor 66) and a protective P channel MOSFET transistor 122 (corresponding to transistor 100). The source of transistor 122 is connected to ground. The drains of transistor 120 and 122 are connected to each other just as are the drains of transistors 100 and 66, and the source of transistor 120 is connected to the regulated voltage line 10. Accordingly, with the arrangement shown in FIG. 5, employing redundant regulating structure, should either tunnel structure 52 or tunnel structure 108 fail and short that portion of the regulator, the other portion of the circuit will continue to regulate the programming voltage on line 10 in the manner described above.

Figure 6:
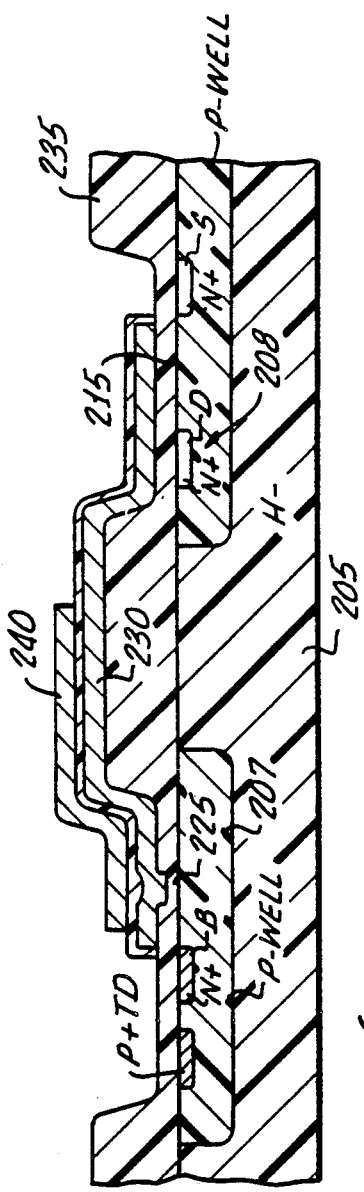
FIG. 6 is a cross sectional view illustrative of structure of a floating gate transistor of the type employed in nonvolatile programmable devices that may be regulated according to the present invention.

FIG. 6 illustrates a simplified structural configuration of a typical floating gate N channel transistor memory element. This is but one of many similar components formed on the single chip during the manufacturing process, and which are regulated by the described shunt regulator. The construction of floating gate N channel C MOS transistors is well known to those skilled in the art and need not be described in great detail. Such a transistor may be part of a nonvolatile programmable structure such as, for example, the nonvolatile latch shown in my U.S. Pat. No. 4,571,704, issued Feb. 18, 1986. In the typical arrangement of FIG. 6, various layers are laid down one after the other, according to known manufacturing processes. The illustrated structure includes a region 205 comprising an N-type silicon, having P−wells 207,208, in which a highly doped P+region forms a tie down (TD) region for biasing the P−well. Doped N+regions B, S and D respectively form one side of a tunnel oxide structure, the source S and the drain D of the transistor. N+region B does not form a part of the N channel field effect transistor, its function being to form one side of the tunnel oxide structure. The transistor control gate is formed by a conductive layer 240. An insulation layer 210 separates the floating gate 230 of the transistor from the control gate 240. Field oxide regions 235, tunnel oxide layer 225 and gate oxide layers 215 separate the floating gate 230 from the P−wells.

Floating gate 230 is a conductive layer formed of a polycrystaline N type silicon which is conductive at all times. Floating gate 230 has a portion disposed adjacent the N+region B. The tunnel oxide layer 225 between the floating gate and the top surface of P−well region 207 adjacent N+region B is substantially thinner than the gate oxide region 215 between the floating gate and the channel region of the transistor. The field oxide region 235 is substantially thicker than the gate oxide layer 215. Depending upon the particular technology with which the device is fabricated, the N+region B may be disposed directly beneath the tunnel oxide layer 225 rather than adjacent the area beneath the tunnel oxide.

In the manufacture of the total circuit, as the various devices, including the transistor schematically illustrated in FIG. 6, are formed, the various components of the shunt regulator are also formed on the same substrate. The various layers of the shunt regulator are formed at the same time as, and by the same processing steps, as are the corresponding layers of the circuit devices, although located at different horizontal locations on the chip.

Figure 7:
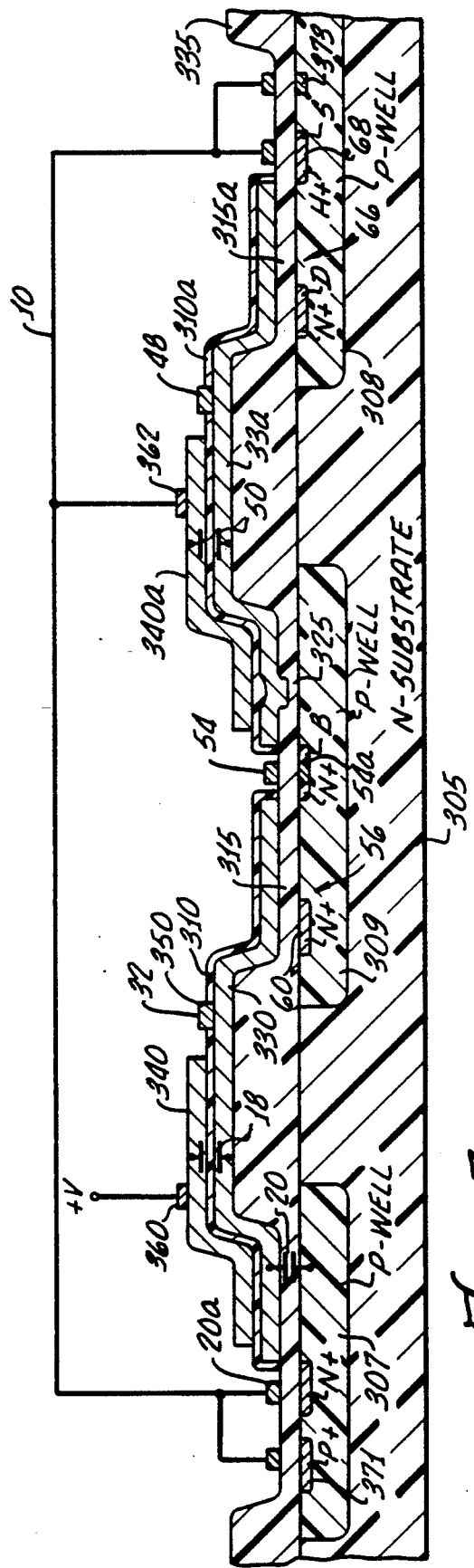
FIG. 7 is a cross sectional view of FIG. 5, of components of the shunt regulator of the present invention.

FIG. 7 is a sectional view corresponding to FIG. 6 illustrating a simplified cross section of portions of the shunt regulator circuit. The illustrated shunt regulator structure includes a region 305 comprising an N- type silicon substrate having P−wells 307,308 in which highly doped N+regions are formed as indicated in the drawings. Control gate layers 340 and 340a are separated from floating gates 330 and 330a by insulation layers 310 and 310a. Field oxide regions 335, tunnel oxide layer 325, and gate oxide layers 315 and 315a separate the floating gates 330 and 330a from the P−wells. The various layers of FIG. 7 that correspond to layers of the transistor of FIG. 6 are designated with similar reference numerals, except that the first digit of each numeral is increased for FIG. 7. Thus control gates 340 and 340a of FIG. 7 correspond to control gate 240 of FIG. 6, etc. N+regions in the P−well 309 form the drain and source of the N channel transistor 56, which interconnects the junction 32 (FIG. 2) with the tunnel structure, formed by tunnel oxide layer 325 (FIG. 7). The interconnection of gate 330 of transistor 56 is provided by a connection 350 (node 32 of FIG. 2) on its control gate 340, which is connected to the drain of transistor 22 (not shown in FIG. 7). Capacitors 18 and 20 are schematically indicated in the drawing of FIG. 7 as comprising the capacitance between layers 340 and 330 for capacitor 18, and between layers 330 and the P−well 307. The tunneling structure 52 of FIG. 2 is the thin oxide layer 325 between floating gate 330a and the P−well 309 of transistor 66. The latter is formed between the N+regions provided in P−well 308 and has a floating gate 330a and control gate 340a. Capacitor 50 of FIG. 2 is formed between the layers that make up transistor 66, between its control gate layer 340a and floating gate layer 330a.

Correspondence of the various layers of the shunt regulator structure of FIG. 7 with the similar layers of the transistor of FIG. 6 is readily seen from this description and the drawings, with the several corresponding layers being manufactured at the same time by the same manufacturing processes. This enables the shunt regulator to track the regulated device. The unregulated program voltage is applied to resistor 14 at node 13 of FIG. 2., and the regulated program output (Vpp) is provided from a connection 362 (node 10 of FIG. 2), which is connected to the top plate of capacitor 50. The regulated output is also connected to source 68 of transistor 66 and, by connector 20a, to the bottom plate of capacitor 20. A P+diffusion 54a, between two N+diffusions in P+well 309 is coupled to source 54 of transistor 56. P+tie downs 371, 373 in P—wells 307 and 308, respectively, are also connected to node 10.

Accordingly, it will be seen that should variations in the manufacturing processes of this chip occur, so as to vary the voltages present or required in the chip, the components of the described shunt regulator will also vary in the same manufacturing process and compensate for such manufacturing process variations.

There have been described arrangements for employing a tunnel structure as a reference to provide voltage regulation which tracks variations in manufacturing processes. The tunnel structure reference draws no DC current, and thus can operate for more than 100,000 cycles. Use of capacitative voltage dividers reduces the amount of current drawn by the regulator. The regulator components require only a small area and can regulate many different circuits on the same circuit chip. The regulator tracks temperature and voltage, as well as manufacturing process variations and draws no DC current when not in use.

What is claimed is:

1. A shunt regulator for use in regulating a programming voltage applied to a programmable device on a program line comprising:
   a regulating transistor connected between the program line and a source of fixed potential,
   a voltage divider having a junction connected to control said transistor and including a tunneling structure, and
   means responsive to said program line for controlling the voltage at said junction.

2. The regulator of claim 1 wherein said means for controlling voltage at said junction comprises a capacitative voltage divider connected between a second source of potential and said program line.

3. The regulator of claim 2 including a transistor interconnected between the junction of the capacitors of said second voltage divider and one side of said first mentioned voltage divider.

4. The regulator of claim 2 including a relatively small capacitor connected between one side of said capacitative voltage divider and said program line, and means for repetitively and alternately charging and discharging said small capacitor.

5. The regulator of claim 1 wherein said voltage divider comprises a first capacitor and said tunneling structure.

6. The regulator of claim 5 including a regulated device having a transistor including a transistor tunneling structure formed by a group of circuit component layers, and wherein said tunneling structure of said voltage divider is formed by said group of layers.

7. The regulator of claim 1 wherein said regulating transistor has layers forming a control gate and a floating gate separated by a dielectric layer, and a substrate separated from said floating gate by a tunneling layer to define a tunneling structure for said transistor, and wherein said capacitative voltage divider includes said tunneling layer.

8. The regulator of claim 7 wherein said second divider comprises a first capacitor formed between said control and floating gates, and a second capacitor formed between said substrate and said floating gate.

9. The regulator of claim 1 including means for disabling said regulating transistor in response to a failure of said voltage divider.

10. The regulator of claim 9 wherein said means for disabling said regulating transistor comprises a fail safe transistor connected between said regulating transistor and a fixed potential source, and means responsive to failure of said divider for operating said fail safe transistor to prevent operation of said regulating transistor.

11. The regulator of claim 10 including a second regulating transistor connected in parallel with said first regulating transistor, a second voltage divider having a junction connected to control said second regulating transistor and including a second tunneling structure, and means for controlling voltage applied to said second capacitative voltage divider.

12. The regulator of claim 11 including means responsive to voltage on said program line for causing said second tunneling structure to conduct and to turn on said second regulating transistor.

13. In combination with a nonvolatile programmable circuit component formed of a plurality of conductive and non-conductive layers and including a programming line for applying a programming voltage to the circuit, an improved shunt regulator for regulating said programming voltage, said regulator comprising:
   a regulating transistor connected between a fixed source of potential and said programming line,
   voltage divider means connected to control operation of said transistor,
   said voltage divider means being formed of the same conductive and non-conductive layers as is said regulated device.

14. The structure set forth in claim 13 wherein said circuit component includes a floating gate transistor having a tunneling structure formed of some of said layers, and wherein said voltage divider means includes a tunneling structure formed of the same layers as form the tunneling structure of said floating gate transistor.

15. The regulator of claim 14 wherein said voltage divider includes a capacitor and said tunneling structure having a junction therebetween connected to control said regulating transistor, and means responsive to voltage level on said programming line for causing said tunneling structure to conduct.

16. The regulator of claim 15 wherein said means for causing said tunneling structure to conduct comprises a second voltage divider connected between a fixed potential source and said programming line.

17. The regulator of claim 16 wherein said first and second voltage dividers each includes a capacitor, and wherein said capacitors are each formed by layers that form the layers of said circuit component.

18. A shunt regulator for controlling voltage on a regulated line to which is applied a programming voltage, said regulator comprising:
   a regulating transistor having a source connected to said regulated line, a drain connected to a first fixed potential and having a control gate,
   a first voltage divider comprising first and second capacitors connected in series between a second source of fixed potential and said regulated line and having a junction therebetween,
   a second transistor having a control gate connected to said junction and having a source electrode,
   a second capacitative voltage divider comprising a tunnel structure having one side connected to said source electrode of said second transistor and a second side connected to the control gate of said regulating transistor, said second divider including a third capacitor having one side connected to the control gate of said regulating transistor and the other side connected to said regulated line, and switch means for initially maintaining said first and second capacitors in discharged condition.

19. The regulator of claim 18 including a smoothing capacitor connected between said second capacitor of said first voltage divider and said regulated line, and means for alternately charging and discharging said smoothing capacitor.

20. The regulator of claim 18 including a fail safe transistor connected between the drain of said regulating transistor and said first fixed potential, said fail safe transistor having a control gate connected to said control gate of said second transistor and being of an opposite polarity type with respect to said regulating transistor.

21. The regulator of claim 18 including a second regulating transistor connected between said first fixed potential and said regulated line and having a control gate, a second tunnel structure having one side coupled to said junction of said first and second capacitors and the other side connected to said control gate of said second regulating transistor, and a fifth capacitor having one side connected to said control gate of said second regulating transistor and the other side connected to said regulated line.

22. The regulator of claim 21 including first and second fail safe means connected to said first and second regulating transistors, respectively, for turning off said respective first and second transistors individually in response to failure of a respective one of said tunnel structures.

* * * * *